United States Patent
Ikekame (10) Patent No.: US 7,239,124 B2
(45) Date of Patent: *Jul. 3, 2007

(54) CURRENT MEASUREMENT TECHNIQUE AND CURRENT MEASUREMENT APPARATUS

(75) Inventor: Hiroshi Ikekame, Kokubunji (JP)

(73) Assignee: Hitachi Global Storage Technologies Japan, Ltd., Odawara-shi (JP)

( * ) Notice: Subject to any disclaimer, the term of this patent is extended or adjusted under 35 U.S.C. 154(b) by 0 days.

This patent is subject to a terminal disclaimer.

(21) Appl. No.: 10/911,615

(22) Filed: Aug. 5, 2004

(65) Prior Publication Data

US 2005/0007093 A1 Jan. 13, 2005

Related U.S. Application Data

(63) Continuation of application No. 10/603,627, filed on Jun. 26, 2003, now Pat. No. 6,833,694.

(30) Foreign Application Priority Data

Sep. 13, 2002 (JP) .............................. 2002-267558

(51) Int. Cl.
*G01R 15/20* (2006.01)

(52) U.S. Cl. ................................. 324/117 H (58) Field of Classification Search ................. 324/96, 324/117 R, 127, 244.1, 158.1, 750, 765; 360/245.9; 359/280–283, 324

See application file for complete search history.

(56) References Cited

U.S. PATENT DOCUMENTS

| 4,933,629 | A | | 6/1990 | Kozuka et al. |
| 5,451,864 | A | * | 9/1995 | Nakamoto .................. 324/96 |
| 5,834,933 | A | | 11/1998 | Meier |
| 5,844,409 | A | | 12/1998 | Bosselmann et al. |

FOREIGN PATENT DOCUMENTS

JP 2000-46891 2/2000

* cited by examiner

*Primary Examiner*—Ha Tran Nguyen
*Assistant Examiner*—Tung X. Nguyen
(74) *Attorney, Agent, or Firm*—Antonelli, Terry, Stout & Kraus, LLP.

(57) ABSTRACT

A current measurement method for measuring a current that flows in a transmission line of an electric circuit including steps of installing a magnetooptical device in a magnetic field which is generated based upon current that flows in the transmission line, making a polarized light on the magnetooptical device, and acquiring a current based upon the variation of the polarization of reflected light from the magnetooptical device on which the polarized light is incident.

11 Claims, 8 Drawing Sheets

CURRENT MEASUREMENT TECHNIQUE AND CURRENT MEASUREMENT APPARATUS

CROSS REFERENCE TO RELATED APPLICATION

This is a continuation of U.S. application Ser. No. 10/603,627, filed Jun. 26, 2003, now U.S. Pat. No. 6,833,694 the subject matter of which is incorporated by reference herein.

BACKGROUND OF THE INVENTION AND RELATED ART STATEMENT

The present invention relates to the measurement of a current waveform, particularly relates to current measurement technique and a current measurement apparatus for measuring high frequency current that flows in a transmission line of an electric circuit which is a load of small impedance.

Heretofore, to measure a current waveform, a method of inserting a resistor of approximately 10Ω in series with an electric circuit and monitoring potential difference between both ends of the resistor by a voltage probe has been adopted.

The defects of this method are as follows.

(1) As the resistor is inserted, the device under a test (DUT) is processed (destructive measurement).

(2) As the proper impedance of the device under the test is varied by the insertion of the resistor, the proper current cannot be measured (electric invasive measurement).

For another method of measuring a current waveform, there is a current probe. In this current probe, current is measured by surrounding the transmission line with a series of ring transformer, applying a magnetic field generated based upon current to this transformer and monitoring induced voltage hereby generated. The defects of this method are as follows.

(3) Lead wire is required to be added to the device under a test and is required to be through the transformer (destructive measurement).

(4) The proper impedance of the device under the test is varied by the impedance (approximately 20 nH because the length is approximately 20 mm) of the inserted lead wire and the proper current cannot be measured (electric invasive measurement).

(5) The bandwidth of the current probe is approximately 1.5 GHz and is small (low-time resolution).

A load of small impedance according to the invention is equivalent to a writing element of a magnetic head of HDD for example. The impedance is 10Ω20 nH or less and as an operating frequency is increased, the impedance has a tendency to further lower. In the above-mentioned conventional measurement technique, as impedance equivalent to the load or larger than the load is inserted into the device under the test, a current waveform far from the proper current is measured.

For a document related to the technique of this type, Japanese Laid-Open No. 2000-46891 can be given.

OBJECTS AND SUMMARY OF THE INVENTION

As described above, as the conventional measurement technique caused the destructive measurement and the electric invasive measurement, the precise measurement of current that flowed in the transmission line of the electric circuit which was the load of small impedance was impossible. Besides, as the frequency band was small (the time resolution was low), the precise measurement of high frequency current was impossible.

The object of the invention is to provide measurement technique and a measurement apparatus wherein the waveform of current that flows in an electric circuit which is a load of small impedance can be measured in wide bandwidth (at high-time resolution) and at high sensitivity without processing the device under a test (non-destructive measurement) and without having an effect of the impedance of the measurement apparatus upon the device under the test (noninvasive measurement).

To achieve the object, the current measurement technique according to the invention is mainly characterized in that when current that flows in a transmission line of the electric circuit is measured, a magnetooptical device is installed in a magnetic field generated based upon the current that flows in the transmission line, polarized light is made incident on the magnetooptical device and current is acquired based upon the variation of the polarization of reflected light from the magnetooptical device on which the polarized light is made incident.

Besides, the current measurement apparatus according to the invention is mainly characterized in that a light source for radiating polarized light, the magnetooptical device which is installed in a magnetic field generated based upon current that flows in the transmission line and which applies the variation of polarization proportional to magnetization induced by the magnetic field to polarized light and reflects the polarized light when the polarized light radiated from the light source is incident and means for converting the variation of the polarization included in the polarized light reflected on the magnetooptical device to an electric signal and measuring current are provided.

According to the current measurement technique and the current measurement apparatus respectively described above, as the transmission line is not processed and no impedance of the measurement apparatus is applied to DUT, nondestructive and noninvasive current measurement is enabled.

Besides, it is desirable in the current measurement technique and the current measurement apparatus according to the invention that a magnetic field generator for applying a magnetic field to the magnetooptical device is further provided. As a frequency response of the magnetooptical device is enhanced by applying a magnetic field generated by the magnetic field generator to the magnetooptical device, current can be measured in wide bandwidth (at high-time resolution).

In the above-mentioned drawings, a reference number 13 denotes a writing amplifier, 14 denotes a transmission line (FPC), 16 denotes a transmission line (ICS), 17 denotes a writing element, 18 denotes a magnetooptical device, 20 denotes a reflecting film, 40 denotes a laser beam source, 41 and 47 denote a collimating lens, 47 denotes an object lens, 42 and 44 denote a polarized beam splitter, 43 denotes a Faraday rotator, 45 denotes a quarter wave plate, 48a and 48b denote a converging lens, 49a and 49b denote a photodiode and 60 denotes a magnetic field generator.

DETAILED DESCRIPTION OF THE PREFERRED EMBODIMENTS

Figure 1:
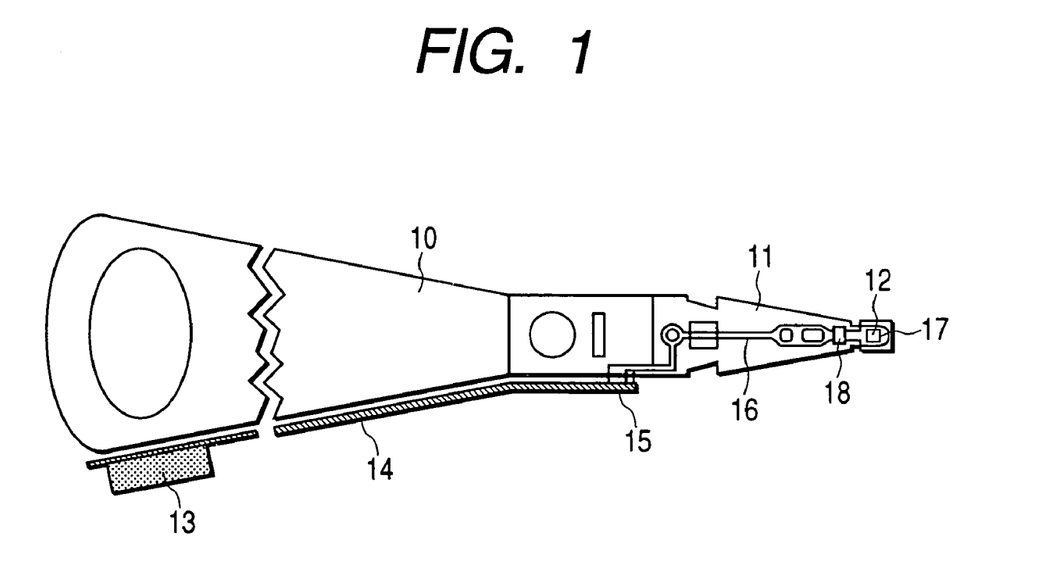
FIG. 1 is a schematic drawing showing a magnetic head which is one example of a small impedance load circuit which is an object of measurement in the invention.

Embodiments of the invention will be described below. Current to be measured is the write current of a magnetic head of HDD. FIG. 1 is a schematic drawing showing a typical magnetic head. A slider 12 flying over a recording medium is fixed to the end of an arm 10 for supporting a mechanism element and an electrical component of the magnetic head via suspension (a blade spring) 11. A writing element 17 for generating a writing magnetic field is, mounted on the end of the slider 12.

Write current for exciting the writing element 17 is generated in a writing amplifier 13 which is a power source of a writing circuit, is propagated via a transmission line (FPC) 14, a junction (or connection) 15 and a transmission line (ICS) 16 and is supplied to the writing element 17 which is a load of small impedance. For a transmission line, differential transmission lines are used and a pair of the transmission line to be an approach route of current to the writing element and the transmission line to be a return route of the current are formed.

In FIG. 1, the two transmission lines 14 and 16 are relayed, however, an integrated transmission line without a junction (or connection) may be also used. Only the writing circuit is described above, however, a reading circuit is similarly formed.

A reference number 18 denotes a magnetooptical device that functions as a sensor for measuring a current waveform. As the magnetooptical device 18 can be installed in a desired position on the transmission line, measurement in various positions can be simply realized. For example, the waveform of write current can be also measured with the magnetooptical device on the writing transmission line and the waveform of noise current of the reading circuit can be also measured with the magnetooptical device on a reading transmission line. The magnetooptical device can be arbitrarily provided on the side of the power source (the writing amplifier 13) and on the side of the load (the writing element 17).

Figure 2A:
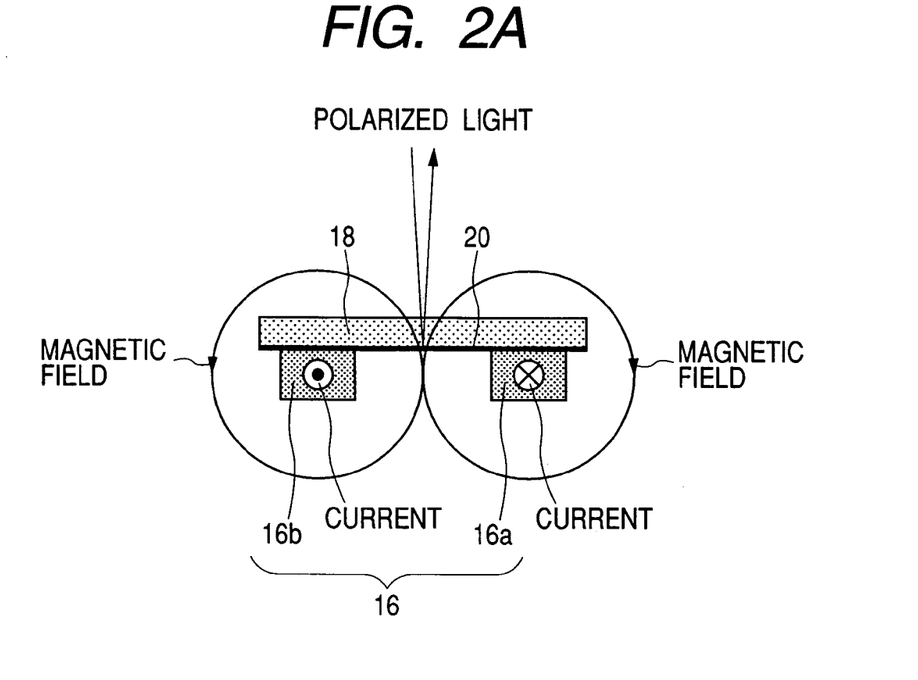
FIGS. 2A and 2B are schematic drawings for explaining an embodiment of a current detector according to the invention.

Next, a method of detecting current to be measured using the magnetooptical device 18 will be described. FIG. 2A is a sectional view showing a state in which the magnetooptical device 18 is installed on the transmission line (ICS) 16 of the magnetic head. The transmission line 16 is differential transmission lines and is composed of a pair of a transmission line (a first transmission line) 16a to be an approach route of the flow of current to the write head 17 and a transmission line (a second transmission line) 16b to be a return route. The magnetooptical device 18 is installed on the two transmission lines 16a and 16b or between the two transmission lines and polarized light is made incident on the magnetooptical device 18 by a laser and others. The polarized light shall be incident on the magnetooptical device 18 and in the middle of the two transmission lines 16a and 16b.

The positioning of an incident laser beam and the installed magnetooptical device 18 is facilitated by placing a marker in the middle of the two transmission lines 16a and 16b or using a magnetic head with a marker in parallel with the transmission lines though the marker is not shown in FIG. 2A.

Current to be measured flowing in each of the transmission lines 16a and 16b generates a magnetic field of quantity proportional to the current in directions shown in the drawing. The magnetic field is applied to the magnetooptical device 18 and the magnetization of quantity proportional to the magnetic field is induced in the magnetooptical device 18. When polarized light is incident on the magnetooptical device 18, the magnetooptical effect (the variation of polarization) of quantity proportional to the magnetization is acquired.

The variation of the polarization is converted to an electric signal and an electric variable proportional to measured current can be acquired. The variation in time (the waveform) of the measured current can be measured by measuring the variation in time of the electric variable. The electric variable can be converted to a current value (calibrated to an absolute value) by standardizing the electric variable to a known value.

As described above, according to the invention, as the magnetooptical device 18 has only to be installed on the transmission lines, DUT is not processed and the impedance of the measurement apparatus has no effect. Precise measurement which cannot be realized in the conventional measurement technique, that is, nondestructive and noninvasive measurement can be realized.

The magnetooptical device 18 is made of material that produces Faraday effect such as bismuth substituted yttrium iron garnet (Bi—YIG) or material that produces polar Kerr effect such as terbium iron cobalt (TbFeCo). The material is selected in consideration of the wavelength of used light and the magnitude of magnetooptical effect in the wavelength.

For example, a laser having the wavelength of 1550 nm which is often used in optical communication is used for the light source and Bi—YIG that produces Faraday effect in the wavelength of 1550 nm is used for the magnetooptical device 18. As Bi—YIG produces further larger Faraday effect in the wavelengths of 830 nm and 780 nm, compared with 1550 nm, a laser having either wavelength is used for the light source and further larger signal output can be also acquired.

Figure 2B:
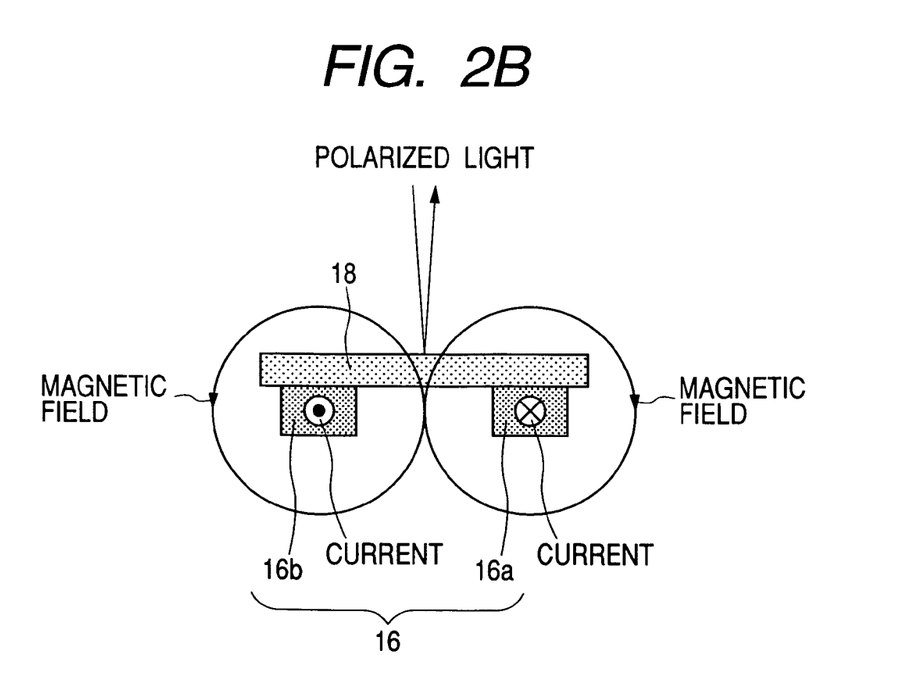

As material that produces Faraday effect transmits incident polarized light, a reflecting film 20 made of a dielectric is formed at the bottom of the magnetooptical device 18 and the polarized light is reflected by it. As material that produces polar Kerr effect reflects polarized light on the surface of the magnetooptical device as shown in FIG. 2B, no reflecting film 20 is required.

The case that the transmission line of DUT is differential transmission lines is described above. Each magnetic field generated based upon current flowing in the two transmission lines is applied to the magnetooptical device in a position in which polarized light is incident in cooperation by installing the magnetooptical device 18 on the differential transmission lines or between the differential transmission lines and making polarized light incident on the magnetooptical device 18 and between the differential transmission lines as shown in FIG. 2A. As the direction of magnetization induced in the magnetooptical device and a direction in which light travels are parallel, large Faraday effect and polar Kerr effect (measured signal output) can be acquired and as a result, sensitive measurement having satisfactory S/N ratio can be realized.

Figure 3A:
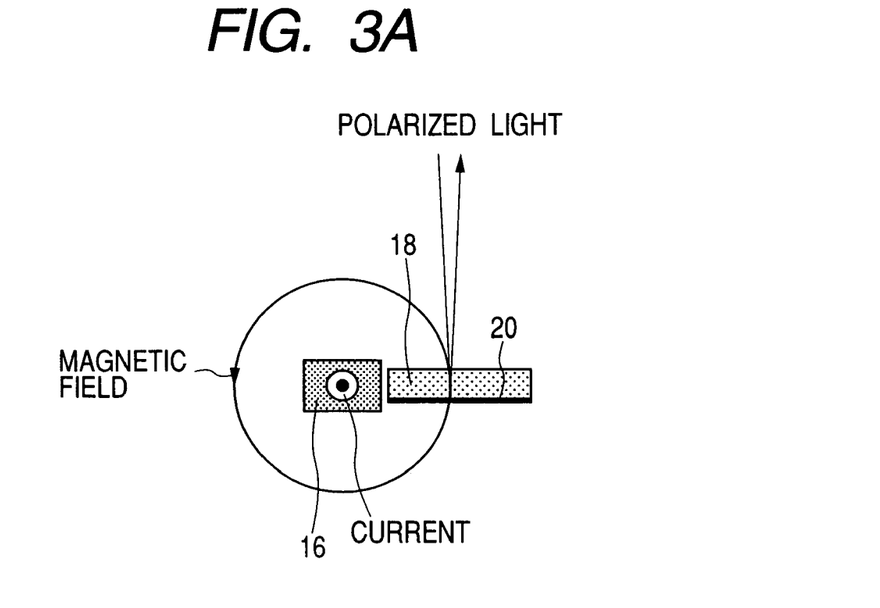
FIGS. 3A and 3B are schematic drawings for explaining another embodiment of the current detector according to the invention.

In the case of a single line in which either transmission line is common to a grounding conductor, large magnetooptical effect can be acquired by making the direction of magnetization and a direction in which light travels parallel in a position in which polarized light is incident as shown in FIG. 3A.

Figure 3B:
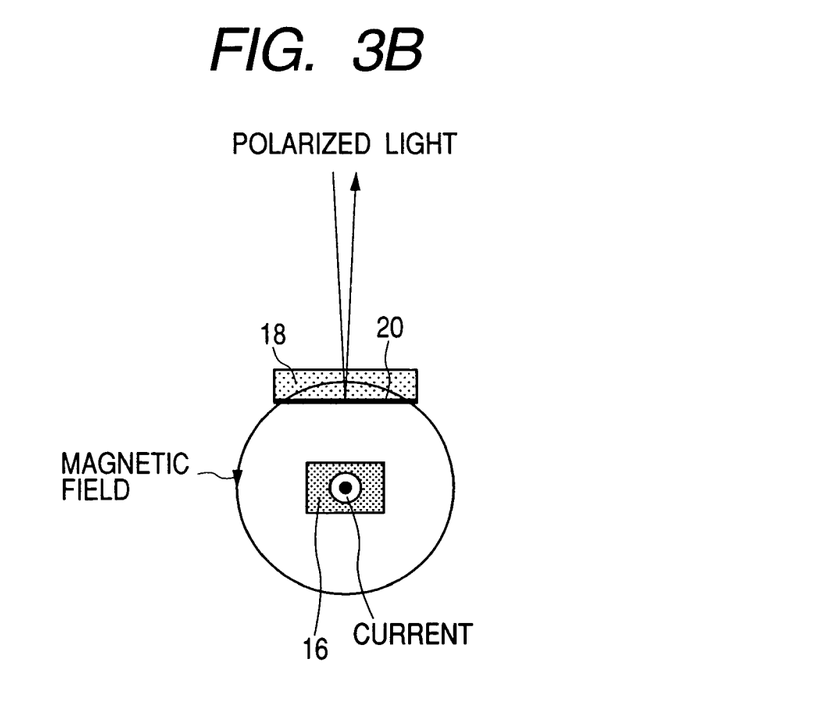

In the meantime, in the case of arrangement shown in FIG. 3B, as the direction of magnetization and a direction in which light travels in a position in which polarized light is incident are perpendicular, Faraday effect and polar Kerr effect (measured signal output) enough to measure cannot be acquired to be measurement inferior in sensitivity and S/N ratio.

Figure 4:
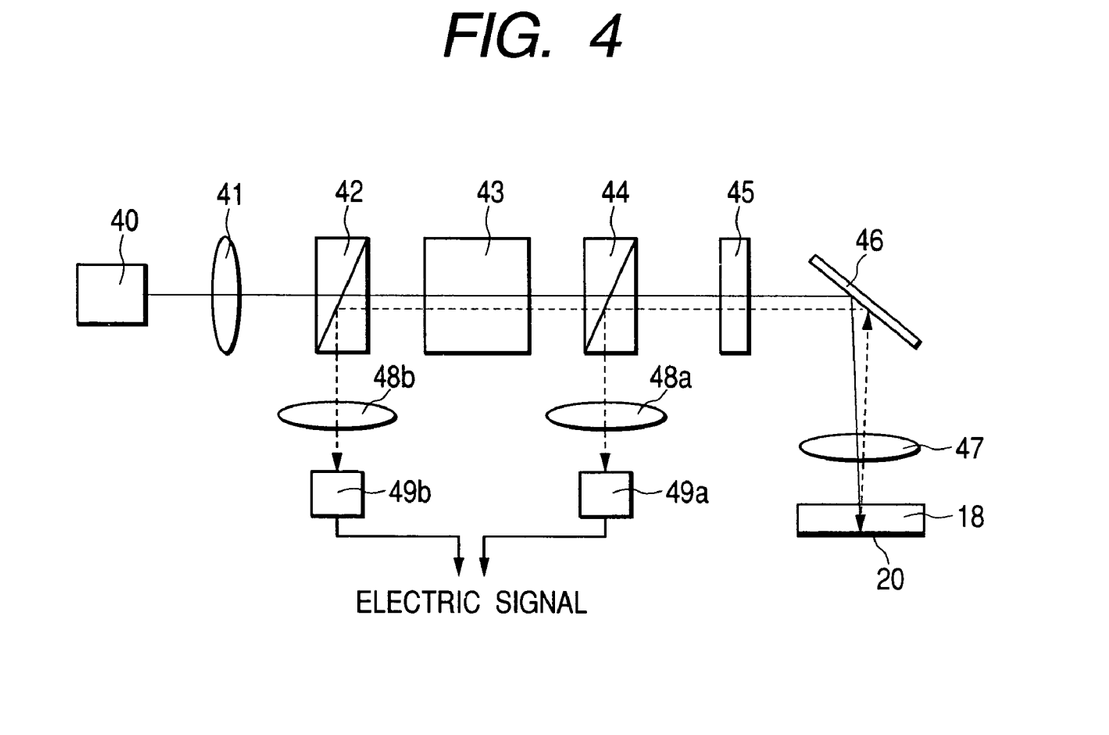
FIG. 4 is a schematic drawing showing an embodiment of the configuration of optical elements according to the invention.

Next, referring to FIG. 4, the configuration of optical elements for measuring the Faraday effect and the polar Kerr effect of the magnetooptical device 18 will be described. A laser beam radiated from a laser 40 which is a light source is made collimated light after the beam passes a collimating lens 41, passes a polarized beam splitter 42, a Faraday rotator 43 and a polarized beam splitter 44, further passes a quarter wave plate 45, is converged by a object lens 47 after the optical path is varied by a mirror 46 and is incident on the magnetooptical device 18. When the laser beam is transmitted in the magnetooptical device 18, a polarized state of light varies by Faraday effect or polar Kerr effect.

When the magnetooptical device 18 is made of a substance that produces Faraday effect, incident light is reflected on the reflecting film 20 formed at the bottom. When the magnetooptical device 18 is made of a substance that produces polar Kerr effect, incident light is reflected on the surface of the magnetooptical device 18.

Reflected light from the magnetooptical device 18 is restored to collimated light again by the object lens 47, passes the quarter wave plate 45 via the mirror 46, a part is reflected by the polarized beam splitter 44, is incident on a photodiode 49a via a converging lens 48a and is converted to an electric signal. The laser beam that passes the polarized beam splitter 44 is reflected by the polarized beam splitter 42, is incident on a photodiode 49b via a converging lens 48b and is converted to an electric signal.

Quantity proportional to measured current is expressed as difference between the output of the two photodiodes 49a and 49b and a current waveform can be measured by detecting the difference in the output using an oscilloscope and others (via a preamplifier if necessary).

The quarter wave plate 45 is provided to adjust the ratio of the intensity of laser beams incident on the photodiode 49a and the photodiode 49b and when a value of measured current is zero (no current flows), that is, when a polarized state is unchanged, the difference of the output is adjusted to zero. Hereby, the zero (the criterion) of a measured signal is determined.

The polarized beam splitter 42, the Faraday rotator 43, the polarized beam splitter 44 and the quarter wave plate 45 form an isolator.

Next, relation among current to be measured, the difference (differential output) between the output of the two photodiodes 49a and 49b shown in FIG. 4 and current acquired in measurement will be described.

Figure 8A:
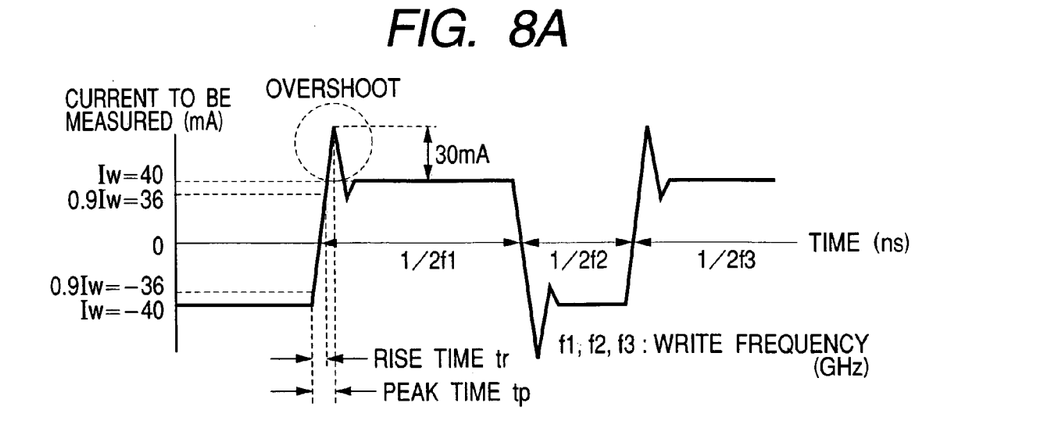
FIGS. 8A, 8B and 8C are explanatory drawings for explaining relation among current to be measured, the differential output of a current measurement apparatus according to the invention and current acquired in measurement.

FIG. 8A shows one example of the variation in time (a current waveform) of write current (current to be measured) that flows in the magnetic head. An overshoot of 30 mA exists in a leading edge and in a trailing edge of a pulse wave having amplitude from −40 mA to +40 mA. To operate the magnetic head at a satisfactory characteristic of a high frequency, the amplitude of the pulse wave, the magnitude of the overshoot and the rise time, the fall time and the peak time of the waveform are important.

Figure 8B:
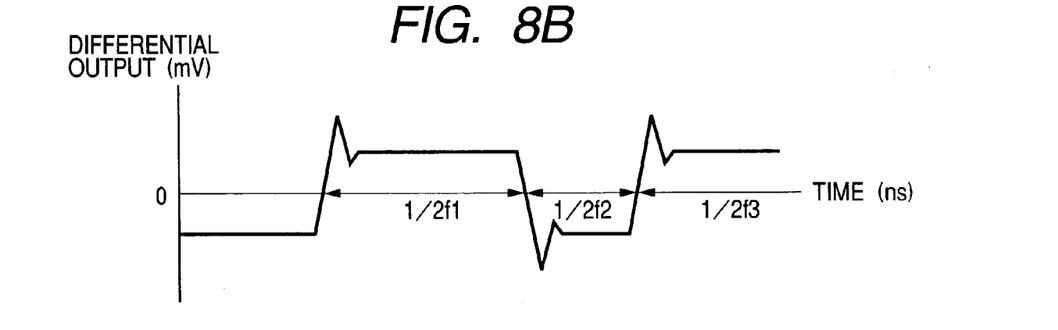

FIG. 8B shows differential output voltage when the current to be measured shown in FIG. 8A is measured by the current measurement apparatus according to the invention. The differential output of the photodiodes 49a and 49b is proportional to current to be measured as described above. That is, as relation between both is linear, the waveform of differential output voltage is similar to the waveform of current to be measured shown in FIG. 8A.

Figure 8C:
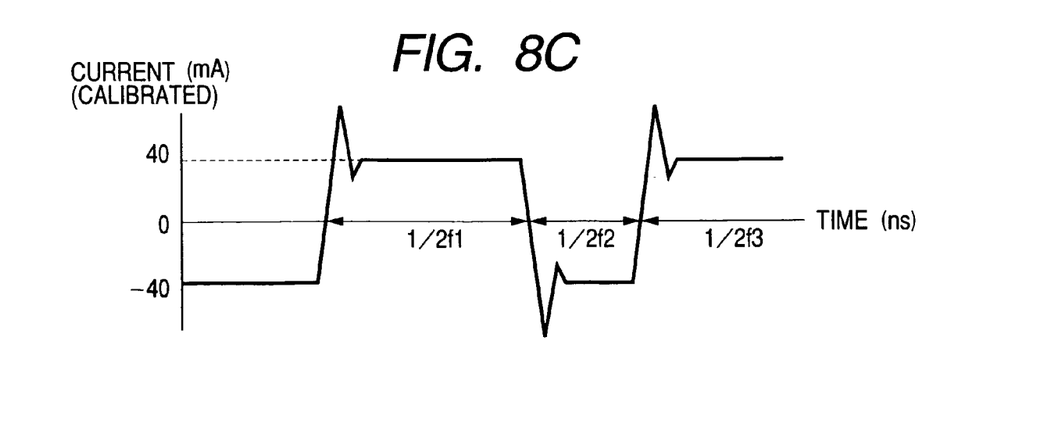

FIG. 8C shows a current value (calibrated to an absolute value) to which the differential output voltage shown in FIG. 8B is converted. As a flat part (a DC part) of a current waveform to be measured has a known value of +40 mA or −40 mA, it is standardized with the value as a criterion. In this embodiment, as the current value of the flat part (the DC part) of the waveform is known, the above-mentioned standardizing method is used, however, a standardizing method is not limited to this. If relation between a known current value and differential output voltage under a measurement condition at that time is known, the absolute value of a current value can be easily acquired by standardization.

Figure 9:
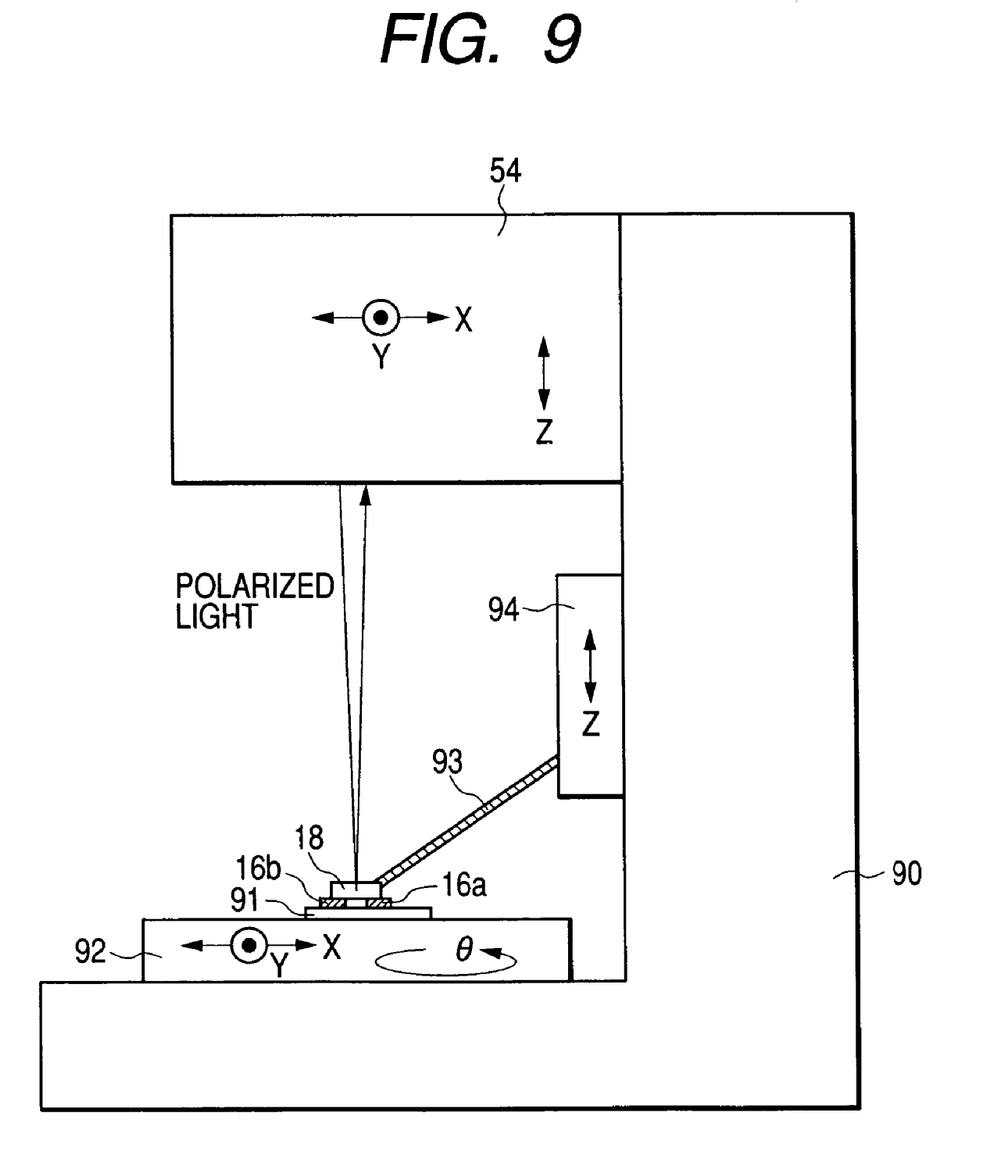
FIG. 9 is a schematic drawing showing the current measurement apparatus according to the invention.

Next, referring to FIG. 9 which is a side view for schematically explaining the current measurement apparatus according to the invention, the current measurement apparatus according to the invention will be described. A sample stage 92 for installing DUT 91 (the magnetic head in this embodiment) is provided to a frame 90. The sample stage 92 is movable in directions of X, Y and θ so that positioning is facilitated. The magnetooptical device 18 is fixed to a supporting mechanism 94 via a supporting arm 93.

The supporting mechanism 94 is fixed to the frame 90 and is movable in a direction of Z so that the installation of the magnetooptical device 18 on DUT 91 is facilitated. A reference number 54 denotes an optical element unit including the optical elements shown in FIG. 4 and the optical element unit is fixed to the frame 90. The optical element unit 54 is also provided with a Z-direction movable mechanism for focusing a laser beam spot on the magnetooptical device 18 in addition to an XY-direction movable mechanism for positioning an incident position of a laser beam.

As the optical element unit 54 and the magnetooptical device 18 can be integrated, the apparatus can be miniaturized. The current measurement apparatus of a handy type such as a pen type has effect that availability is enhanced and the apparatus can be widely applied. For example, if the current measurement apparatus according to the invention is used in a process for the inspection of a magnetic head manufacturing line, current can be precisely and simply checked.

Figure 5:
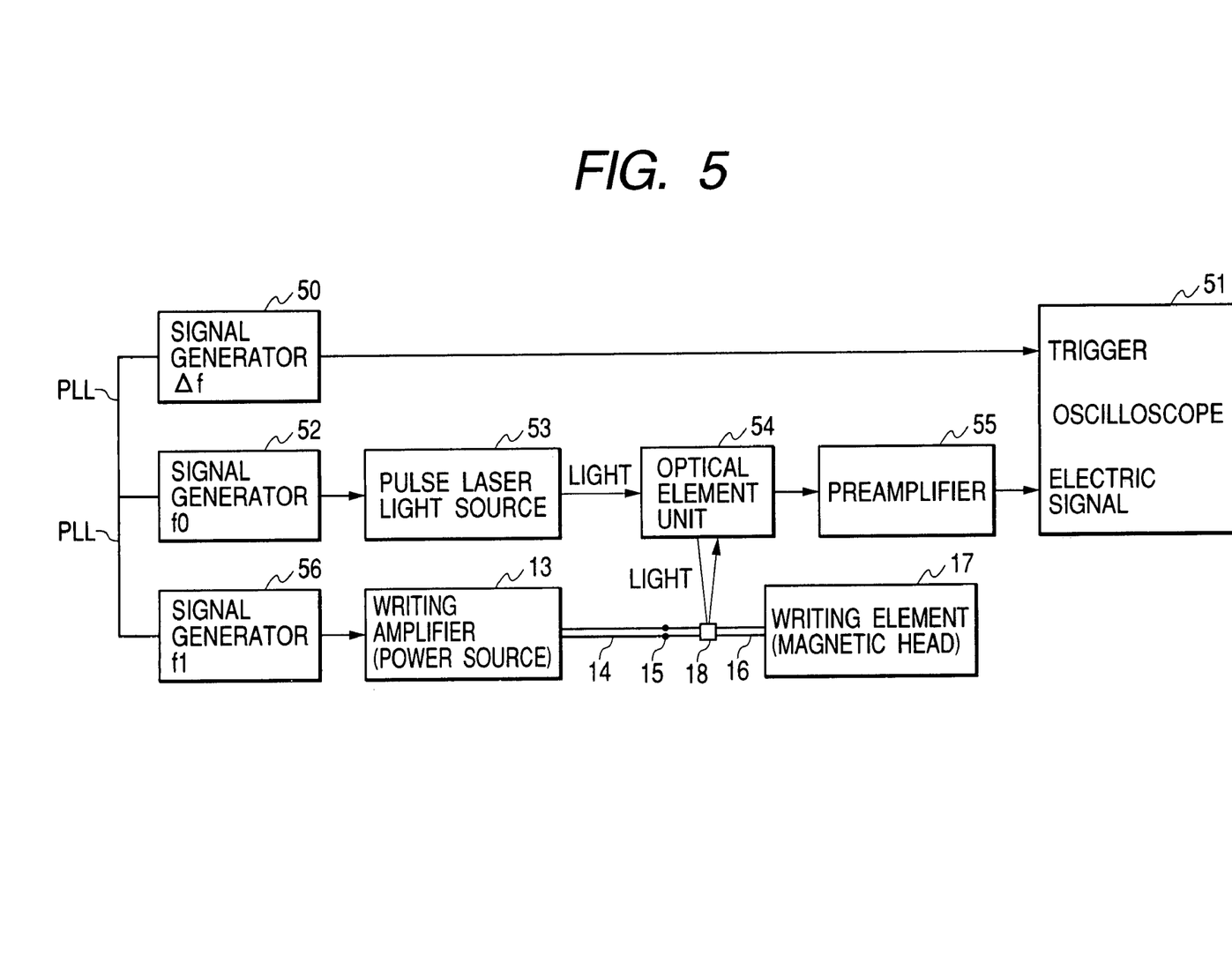
FIG. 5 is a block diagram schematically showing an embodiment of the configuration of a sampling measurement system according to the invention.

Next, referring to FIG. 5, an embodiment of an apparatus wherein measurement at very high-time resolution (in wide bandwidth) is enabled by using a pulse laser for the laser beam source 40 shown in FIG. 4 will be described.

A signal generator 50 is oscillated at a frequency Δf and its signal is used for a trigger of an oscilloscope 51. A signal generator 52 is oscillated at a frequency f0 and its signal is transmitted to a pulse laser beam light 53. A pulse laser beam emitted at the frequency of f0 is transmitted to the optical element unit 54 provided with the optical elements shown in FIG. 4 and an electric signal having the information of current to be measured is output to a preamplifier 55 from the optical element unit 54.

After the electric signal is amplified in the preamplifier 55, it is measured in the oscilloscope 51 and hereby, a desired current waveform is acquired. A signal generator 56 is connected to the writing amplifier 13 that functions as a power source for supplying write current to the magnetic head and controls so that the frequency of write current is f1.

The three signal generators 50, 52 and 56 are connected in a phase locked loop (PLL) and oscillation is synchronized. The sampling measurement of current to be measured is realized by relating the frequencies of the three signal generators so that they are shown in an expression f1=n× f0+Δf and hereby, measurement at very high-time resolution (in wide bandwidth) is enabled.

That is, the sampling measurement of current to be measured is enabled by using the pulse laser for a light source and oscillating the pulse laser in synchronization with current to be measured and measurement at very high-time resolution (in wide bandwidth) is enabled.

Figure 6:
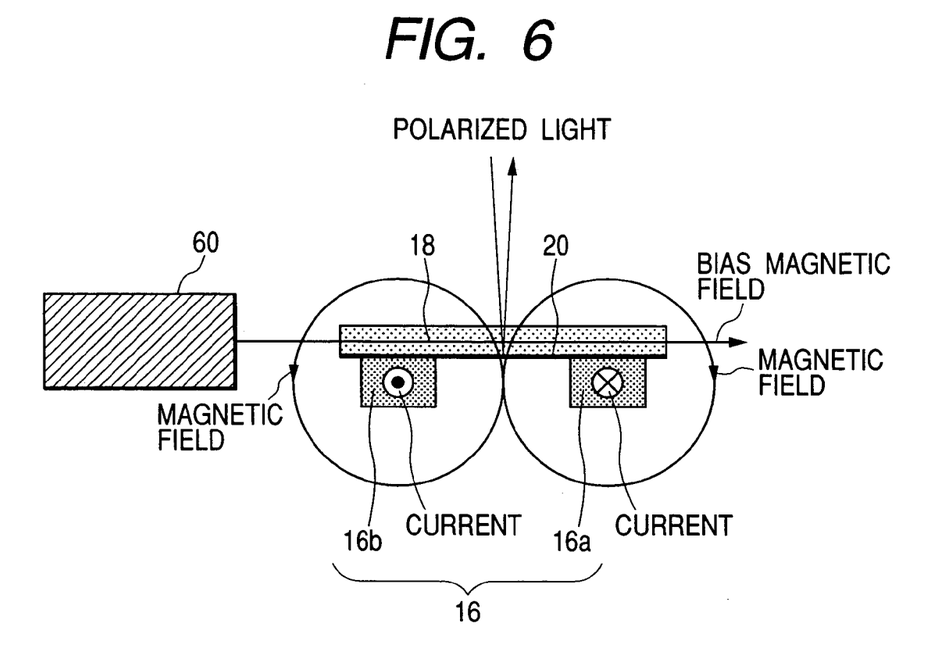
FIG. 6 is a schematic drawing for explaining an embodiment of a current detector for realizing wide bandwidth according to the invention.

Next, an embodiment in which the responsibility of the magnetooptical device 18 to measured current is improved and high-time resolution (wide bandwidth) is realized will be described. FIG. 6 shows the same differential transmission lines 16a and 16b, the same magnetooptical device 18 and the same reflecting film 20 as those in FIG. 2A and also shows a magnetic field generator 60 newly used. The magnetic field generator 60 is used to apply a magnetic field (a bias magnetic field) different from a magnetic field generated based upon current to be measured to the magnetooptical device 18 beforehand. A direction in which the magnetic field is applied is parallel to the surface of the magnetooptical device 18 as shown in FIG. 6. The magnetic field generator 60 is made of a permanent magnet or an electromagnet.

Figure 7:
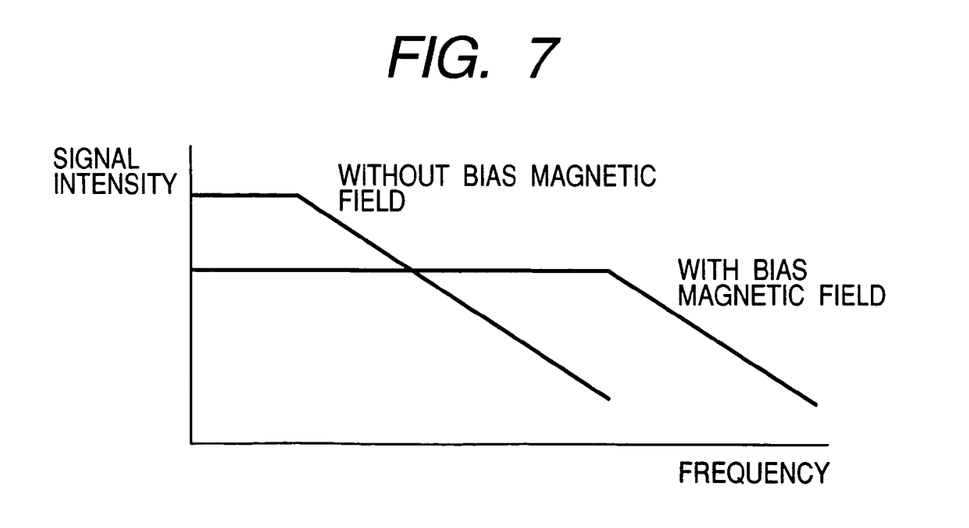
FIG. 7 is an explanatory drawing for explaining bandwidth acquired in the embodiment shown in FIG. 6.

FIG. 7 shows bandwidth when a bias magnetic field is applied to the magnetooptical device 18 and when no bias magnetic field is applied. Effect that the bandwidth can be extended, as a result, measurement at high-time resolution is enabled and precise current waveform measurement can be realized is produced by applying a bias magnetic field to the magnetooptical device 18.

In the above-mentioned embodiments, the examples of the measurement of the waveform of write current that flows in the writing transmission line have been described, however, an object of measurement is not limited to this. For example, the invention can be also applied to the measurement of the waveform of noise current that flows in a reading transmission line.

Besides, effect that proportion defective can be remarkably reduced is produced by applying the nondestructive and noninvasive precise measurement technique and measurement apparatus according to the invention to the inspection of the waveform of write current and the waveform of reading noise current in a production line of a magnetic hard disk drive unit.

In Japanese Laid-Open No. 2000-46891, a test method of verifying the connection of an electric connection using an electro-optic element for applying a phase variation by voltage proportional to electric field intensity to a polarized component from a polarizer is disclosed, however, the invention is different in that the magnetooptical device is installed in a magnetic field, the variation of polarization proportional to magnetization induced by the magnetic field is applied to polarized light and the polarized light is reflected.

The characteristics of the current measurement technique according to the invention will be described below.

(1) The current measurement technique based upon the current measurement technique of current that flows in the transmission line of the electric circuit and characterized in that the magnetooptical device is installed in a magnetic field generated based upon current that flows in the transmission line, polarized light is made incident on the magnetooptical device and current is acquired based upon the variation of the polarization of reflected light from the magnetooptical device on which the polarized light is incident.

(2) The current measurement technique based upon the current measurement technique for measuring current that flows in the transmission line of the electric circuit provided with the first transmission line to be the approach route of the flow of current and the second transmission line to be the return route of the flow of the current and characterized in that the magnetooptical device is arranged in a magnetic field generated based upon current that flows in the first transmission line and in a magnetic field generated based upon current that flows in the second transmission line, polarized light is made incident on the magnetooptical device and between the first transmission line and the second transmission line and current is acquired based upon the variation of the polarization of reflected light from the magnetooptical device on which the polarized light is incident.

(3) The current measurement technique based upon the current measurement technique (1) or (2) and characterized in that polarized light is made incident on the magnetooptical device in a state in which a magnetic field generated by the magnetic field generator is further applied to the magnetooptical device.

(4) The current measurement technique based upon the current measurement technique (1) or (2) and characterized in that the direction of magnetization in the incident position of the polarized light and the direction in which the polarized light travels are parallel.

(5) The current measurement technique based upon the current measurement technique (1) or (2) and characterized in that the electric circuit is a circuit which is a load of small impedance and the current is high frequency current.

As described above, according to the current measurement technique and the current measurement apparatus according to the invention, as sensitive current waveform measurement in wide bandwidth (at high-time resolution) can be realized without processing DUT (nondestructive) and without having an effect of the impedance of the measurement apparatus (noninvasive), effect that precise measurement in which proper current that flows in DUT is acquired is enabled is produced.

What is claimed is:

1. A current measurement method for measuring a current that flows in an electric current transmission line of an electric circuit, comprising the steps of:

installing a magnetooptical device in a magnetic field which is generated based upon an electric current that flows in the electric current transmission line;

making a polarized light incident on the magnetooptical device; and acquiring a current based upon the variation of the polarization of reflected light from the magnetooptical device on which the polarized light is incident.

2. A current measurement method according to claim 1, wherein the polarized light is made incident on the magnetooptical device in a state in which a magnetic field generated by a magnetic field generator is further applied to the magnetooptical device.

3. A current measurement method according to claim 1, wherein the direction of magnetization in the incident position of the polarized light and the direction in which the polarized light travels are parallel.

4. A current measurement method according to claim 1, wherein the electric circuit is a circuit which is a load of small impedance and the current is high frequency current.

5. A current measurement method for measuring a current that flows in a transmission line of an electric circuit provided with a first transmission line which is on an approach route of the flow of current and a second transmission line which is on a return route of the flow of the current, comprising the steps of:

arranging a magnetooptical device in a magnetic field which is generated based upon current that flows in the first transmission line and in a magnetic field which is generated based upon current that flows in the second transmission line;

making a polarized light incident on the magnetooptical device and between the first transmission line and the second transmission line; and acquiring a current based upon the variation of the polarization of reflected light from the magnetooptical device on which the polarized light is incident.

6. A current measurement method according to claim 5, wherein the polarized light is made incident on the magnetooptical device in a state in which a magnetic field generated by a magnetic field generator is further applied to the magnetooptical device.

7. A current measurement method according to claim 5, wherein the direction of magnetization in the incident position of the polarized light and the direction in which the polarized light travels are parallel.

8. A current measurement method according to claim 5, wherein the electric circuit is a circuit which is a load of small impedance and the current is high frequency current.

9. A current measurement method for measuring a current that flows in an electric current transmission line of an electric circuit, comprising the steps of:

installing a magnetooptical device in a magnetic field which is generated based upon a low impedance current that flows in the electric current transmission line;

making a polarized light incident on the magnetooptical device; and acquiring a current based upon the variation of the polarization of reflected light from the magnetooptical device on which the polarized light is incident.

10. A current measurement method according to claim 9, wherein the polarized light is made incident on the magnetooptical device in a state in which a magnetic field parallel to the polarized incident plane of the magnetooptical device is generated by an external magnetic field generator and further applied to the magnetooptical device.

11. A current measurement method according to claim 9, wherein the current flowing through the electric current transmission line is a high frequency current.

* * * * *